(12) United States Patent
Toyooka et al.

(10) Patent No.: US 8,870,387 B2
(45) Date of Patent: Oct. 28, 2014

(54) LIGHT SOURCE CONTROL DEVICE, PROJECTOR, AND LIGHT SOURCE CONTROL METHOD

(75) Inventors: Takashi Toyooka, Matsumoto (JP); Kazuhisa Mizusako, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 332 days.

(21) Appl. No.: 13/274,711

(22) Filed: Oct. 17, 2011

(65) Prior Publication Data

US 2012/0099084 A1   Apr. 26, 2012

(30) Foreign Application Priority Data

Oct. 20, 2010   (JP) .................................. 2010-235475

(51) Int. Cl.
| | | |
|---|---|---|
| G03B 21/20 | (2006.01) | |
| H01J 1/62 | (2006.01) | |
| H01J 63/04 | (2006.01) | |
| H05B 33/08 | (2006.01) | |
| G03B 21/14 | (2006.01) | |

(52) U.S. Cl.
CPC ............ *G03B 21/14* (2013.01); *G03B 21/2033* (2013.01); *H05B 33/0827* (2013.01); *H05B 33/0848* (2013.01); *G03B 21/2026* (2013.01); *G03B 21/2053* (2013.01)
USPC ............................................ 353/85; 313/498

(58) Field of Classification Search
CPC ............. G03B 21/2053; G03B 21/206; G03B 21/2033; H04N 9/3197
USPC ....................... 353/85, 121, 94; 313/498, 500; 315/194–199; 362/800; 348/742
See application file for complete search history.

(56) References Cited

U.S. PATENT DOCUMENTS

| | | | | |
|---|---|---|---|---|
| 6,992,718 | B1 | 1/2006 | Takahara | |
| 7,553,033 | B2 * | 6/2009 | Seki | ................................. 353/85 |
| 8,444,276 | B2 | 5/2013 | Shibasaki | |
| 2006/0170883 | A1 * | 8/2006 | Matsui | ............................ 353/85 |
| 2006/0215124 | A1 * | 9/2006 | Seo | .................................... 353/52 |
| 2009/0040475 | A1 * | 2/2009 | Sagawa | ........................... 353/85 |
| 2009/0189845 | A1 | 7/2009 | Toyooka | |
| 2009/0195707 | A1 * | 8/2009 | Mizushima et al. | .......... 348/744 |

FOREIGN PATENT DOCUMENTS

| | | |
|---|---|---|
| JP | 05-066501 A | 3/1993 |
| JP | 2000-194067 A | 7/2000 |
| JP | 2008-198430 A | 8/2008 |
| JP | 2009-175627 A | 8/2009 |
| JP | 2011-075919 A | 4/2011 |

* cited by examiner

*Primary Examiner* — William C Dowling
*Assistant Examiner* — Ryan Howard
(74) *Attorney, Agent, or Firm* — Maschoff Brennan

(57) ABSTRACT

A light source control device and a light source control method each capable of preventing the scroll noise from occurring without being affected by the characteristics of a light modulation device, and a projector equipped with the light source control device are provided. The light source device includes a duty determination section adapted to determine a duty ratio, and a drive control section adapted to perform drive control of a plurality of solid-state light sources by generating a PWM signal having the duty ratio determined by the duty ratio determination section, and adapted to make a phase with which at least one of the solid-state light sources is driven different from a phase with which another of the solid-state light sources is driven.

10 Claims, 7 Drawing Sheets

LIGHT SOURCE CONTROL DEVICE, PROJECTOR, AND LIGHT SOURCE CONTROL METHOD

BACKGROUND

1. Technical Field

The present invention relates to a light source control device, a projector, and a light source control method.

2. Related Art

Solid-state light sources such as laser diodes (LD) or light emitting diodes (LED) have advantages such as low power consumption, long life, small amount of heat generation, possibility of downsizing, and easiness of lighting/extinction control. Therefore, in recent years, the solid-state light sources have been fast becoming to be used in a variety of fields. For example, in the projectors for displaying images on the screen, the solid-state light sources have started to be actively used for the purpose mainly of reducing the power consumption and the amount of heat generation to thereby achieve downsizing and weight reduction.

The pulse width modulation (PWM) control is often used for controlling the solid-state light sources. This is adopted for the reasons, for example, that the control is easily performed using a digital circuit, that constant light intensity can stably be obtained, and that it is highly efficient. The solid-state light sources used in the projectors are PWM-controlled at a control frequency of about several hundred Hz so as to prevent the flicker from being visually recognized by the user. Further, the light modulation device (e.g., a light valve for modulating the light from the solid-state light source in accordance with an image signal) provided to the projector is also driven at a frequency (e.g., 60 Hz) at which the flicker is not visually recognized by the user.

The flicker caused by performing the PWM control of the solid-state light source and the flicker caused by driving the light modulation device described above are both composed mainly of the high-frequency component which the user fails to recognize visually. However, in some cases, the both flickers interfere with each other to thereby generate a low-frequency component, and thus the flicker and a scroll noise, which can be visually recognized by the user, may be generated. Here, the scroll noise denotes the phenomenon that a stripe-shaped bright part and a stripe-shaped dark part extending in the lateral direction of the screen move slowly upward or downward on the screen. JP-A-2009-175627 (Document 1) discloses a technology of varying the blinking period of the solid-state light source to thereby prevent the scroll noise from occurring.

Incidentally, the technology disclosed in Document 1 mentioned above is for eliminating the regularity of the interference component between the both flickers (the flicker caused by performing the PWM control of the solid-state light source and the flicker caused by driving the light modulation device) by varying the blinking period of the solid-state light source to thereby prevent the scroll noise from occurring. Therefore, the blinking period (the control frequency of the PWM control) of the solid-state light source set in Document 1 is closely associated with the state of the flicker caused by driving the light modulation device.

Therefore, even if the blinking period of the solid-state light source with which the scroll noise can be prevented from occurring for a certain light modulation device is set, there can arise a situation in which the scroll noise cannot be prevented from occurring if the light modulation device changes. Therefore, in the technology disclosed in Document 1 mentioned above, there arises a problem that it is required to reconfigure the blinking period of the solid-state light source, which forces troublesome operations, if the light modulation devices different in characteristics from each other are used.

SUMMARY

An advantage of some aspects of the invention is to provide a light source control device and a light source control method each capable of preventing the scroll noise from occurring without being affected by the characteristics of a light modulation device, and a projector equipped with the light source control device.

A first aspect of the invention is directed to a light source control device adapted to control a light source device having a plurality of solid-state light sources including a determination section adapted to determine a duty ratio, which is a ratio between an emission time period and an extinction time period of the solid-state light sources in a control period of the light source device, based on a signal representing a target light intensity, which is a light intensity of light required to be emitted from the light source device, and a drive control section adapted to generate a control signal having the duty ratio determined by the determination section, and adapted to make a phase with which at least one of the solid-state light sources is driven different from a phase with which another of the solid-state light sources is driven, thereby performing drive control of the plurality of solid-state light sources.

According to the first aspect of the invention, since the control signal having the duty ratio determined based on the signal representing the target light intensity, and for making the phase with which at least one of the plurality of solid-state light sources is driven different from the phase with which another of the plurality of solid-state light sources is driven is generated to thereby perform drive control of the plurality of solid-state light sources, and thus the flicker caused when performing the pulse width modulation control of the light source device can be reduced or eliminated, the scroll noise can be prevented from occurring without being affected by the characteristics of the light modulation device for modulating the light emitted from the light source device.

Further, in the light source control device according to the first aspect of the invention, there is further provided a current control section adapted to control a current supplied to the solid-state light sources in accordance with the target light intensity and the duty ratio determined by the determination section.

Further, in the light source control device according to the first aspect of the invention, the determination section has a table representing a relationship between the light intensity of the light emitted from the light source device and the duty ratio, and determines the duty ratio corresponding to the target light intensity using the table.

Further, in the light source control device according to the first aspect of the invention, the current control section has a table representing a relationship between the light intensity of the light emitted from the light source device, the duty ratio, and the current supplied to the solid-state light sources, and supplies the solid-state light sources with the current corresponding to the target light intensity and the duty ratio using the table.

Further, in the light source control device according to the first aspect of the invention, the plurality of solid-state light sources are sectioned into n (n denotes an integer one of equal to and greater than two) blocks lighting and extinction of which can be controlled individually, the determination section determines the duty ratio D % to be a value obtained by a formula of a×(100/n) assuming that the target light intensity is denoted by m % (m denotes a number fulfilling 0≤m≤100), and a value obtained by rounding up a value obtained by a formula of m/(100/n) to the whole number is denoted by "a," the drive control section generates n drive signals having respective phases shifted 360/n degree (s) from each other, and the current control section controls the current supplied to the solid-state light sources to be (m/D)×100% of a current, which is supplied to the solid-state light sources when the target light intensity is 100%.

A second aspect of the invention is directed to a light source control device adapted to perform drive control of a light source device having a plurality of light sources while reversing a polarity of an applied voltage, the light source control device including a drive control section adapted to generate a control signal adapted to make a phase with which at least one of the light sources is driven different from a phase with which another of the light sources is driven, thereby performing the drive control of the plurality of light sources.

According to the second aspect of the invention, since the polarity reversal is performed while making the phase with which at least one of the plurality of light sources is driven different from the phase with which another of the plurality of light sources is driven, and thus the flicker caused when performing the drive control of the light source device can be reduced, the scroll noise can be prevented from occurring without being affected by the characteristics of the light modulation device for modulating the light emitted from the light source device.

According to the first aspect of the invention, there is provided a light source control method adapted to control a light source device having a plurality of solid-state light sources including determining a duty ratio, which is a ratio between an emission time period and an extinction time period of the solid-state light sources in a control period of the light source device, based on a signal representing a target light intensity, which is a light intensity of light required to be emitted from the light source device, and performing drive control of the plurality of solid-state light sources by generating a control signal having the duty ratio determined in the determining, and adapted to make a phase with which at least one of the solid-state light sources is driven different from a phase with which another of the solid-state light sources is driven.

According to the second aspect of the invention, there is provided a light source control method adapted to perform drive control of a light source device having a plurality of light sources while reversing a polarity of an applied voltage, the light source control method including the steps of performing the drive control of the plurality of light sources by generating a control signal adapted to make a phase with which at least one of the light sources is driven different from a phase with which another of the light sources is driven.

Another aspect of the invention is directed to a projector including a light source device, a light modulation device adapted to modulate a light from the light source device based on an image signal of an image required to be displayed, a projection optical system adapted to project the light modulated by the light modulation device on a screen, and the light source control device according to any one of the above aspects of the invention, adapted to control the light source device.

According to this aspect of the invention, since there is provided the light source control device capable of reducing or eliminating the flicker caused when performing the drive control of the light source device, the scroll noise can be prevented from occurring without being affected by the characteristics of the light modulation device for modulating the light emitted from the light source device.

Further, in the projector according to this aspect of the invention, there is further provided a target light intensity calculation section adapted to obtain a signal representing the target light intensity from the image signal.

Further, in the projector according to this aspect of the invention, there is further provided an extension processing section adapted to perform an extension process of an image signal used for the modulation in the light modulation device in accordance with the target light intensity obtained by the target light intensity calculation section.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a light source control device, a light source control method, and a projector according to some embodiments of the invention will be described in detail with reference to the accompanying drawings. It should be noted that the embodiments described hereinafter show only some aspects of the invention, but do not limit the scope of the invention, and can arbitrarily be modified within the technical concept of the invention.

Light Source Control Device

First Embodiment

Figure 1:
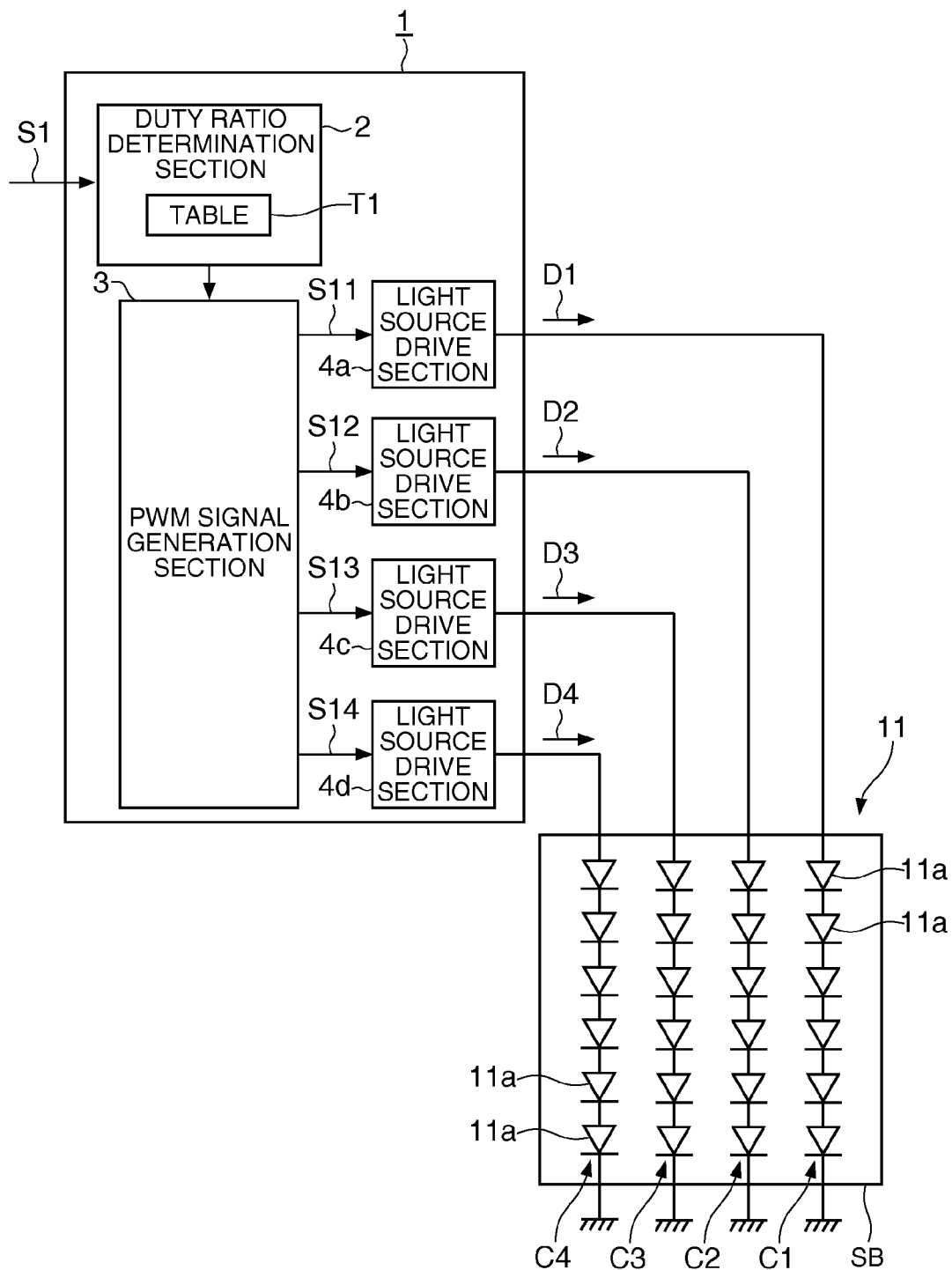
FIG. 1 is a block diagram showing a configuration of a substantial part of a light source control device according to a first embodiment of the invention.

FIG. 1 is a block diagram showing a configuration of a substantial part of a light source control device according to a first embodiment of the invention. As shown in FIG. 1, the light source control device 1 according to the present embodiment is provided with a duty ratio determination section 2 (a determination section), a PWM signal generation section 3 (a drive control section), and light source drive sections 4a through 4d (the drive control section), and controls the drive of a solid-state light source array 11 (a light source device) based on a target light intensity signal S1 input externally. Here, the target light intensity signal S1 is a signal representing the target light intensity as the light intensity of the light to be emitted from the solid-state light source array 11. It should be noted that the target light intensity signal S1 can be a signal representing the brightness of the light to be emitted from the solid-state light source array 11.

As shown in FIG. 1, the solid-state light source array 11 is provided with a plurality of solid-state light sources 11a arranged in a sheet (matrix) on a substrate SB having a roughly rectangular shape, and is driven under the control of the light source control device 1 to thereby emit, for example, blue light. The substrate SB is a plate-like member having a roughly rectangular shape on which the solid-state light sources 11a are mounted, and the solid-state light sources 11a are each a semiconductor laser for emitting blue light having a emission intensity peak at, for example, about 460 nm.

In the example shown in FIG. 1, the 24 solid-state light sources 11a are arranged on the substrate SB in a 6×4 matrix, and the solid-state light sources 11a arranged in the same column are connected in series to each other. In other words, the six solid-state light sources 11a arranged in the column indicated by the reference symbol C1 are connected in series to each other, and the six solid-state light sources 11a arranged in the column indicated by the reference symbol C2 are connected in series to each other. The same is applied to the solid-state light sources 11a arranged in the columns indicated by the symbols C3, C4.

As described above, the plurality of solid-state light sources 11a provided to the solid-state light source array 11 are sectionalized into four blocks by six solid-state light sources 11a provided to the respective columns C1 through C4, and the control of lighting and extinction can be performed by the block (i.e., for each of the columns C1 through C4). It should be noted that the number of solid-state light sources 11a provided to the solid-state light source array 11 can arbitrarily be increased or decreased in accordance with the light intensity to be required.

The duty ratio determination section 2 determines the duty ratio, which is a ratio between an emission time period and an extinction time period of the solid-state light sources 11a in a control period of the solid-state light source array 11, based on the target light intensity signal S1. Specifically, the duty ratio determination section 2 has a table T1 (a first table) representing the relationship between the light intensity of the light emitted from the solid-state light source array 11 and the duty ratio, and determines the duty ratio corresponding to the target light intensity signal S1 using the table T1. In general, the duty ratio determined by the duty ratio determination section 2 rises as the target light intensity indicated by the target light intensity signal S1 rises. It should be noted that the control period described above denotes the PWM control period of the solid-state light source array 11 by the light source control device 1, and is an inverse of the PWM control frequency (in a range of several hundred Hz).

The PWM signal generation section 3 generates the PWM signal for driving the plurality of solid-state light sources 11a provided to the solid-state light source array 11 based on the duty ratio determined by the duty ratio determination section 2. Specifically, the PWM signal generation section 3 generates the PWM signals S11 through S14 (control signals) having the frequency equal to the PWM control frequency, and the duty ratio determined by the duty ratio determination section 2, and making the phases for driving the solid-state light sources 11a provided to the solid-state light source array 11 90 degrees different between the adjacent ones of the columns C1 through C4.

Here, the PWM control frequency described above for defining the frequency of the PWM signals S11 through S14 generated by the PWM signal generation section 3 is set in a range of several hundred Hz so as to prevent the flicker from being visually recognized by the user. Further, since the plurality of solid-state light sources 11a provided to the solid-state light source array 11 can be controlled in lighting and extinction for each of the four columns (the columns C1 through C4), the phases of the PWM signals S11 through S14 are set so as to be different 90 degrees (360 degrees/4) between adjacent ones thereof.

The light source drive sections 4a through 4d respectively generate drive signals D1 through D4 for driving the plurality of solid-state light sources 11a provided to the solid-state light source array 11 for each of the columns C1 through C4 based on the PWM signals S11 through S14 generated by the PWM signal generation section 3. It should be noted that the drive signals D1 through D4 are pulsed signals having the frequencies, the duty ratios, and the phases respectively defined based on the PWM signals S11 through S14, and each providing a constant current (I1 in the present embodiment) when the signal level of the corresponding PWM signal S11 through S14 is in the "H (high)" level.

Then, the operation of the light source control device 1 in the configuration described above will be explained. When the target light intensity signal S1 is externally input to the light source control device 1, the target light intensity signal S1 is input to the duty ratio determination section 2, and the duty ratio, which is the ratio between the emission time period and the extinction time period of the solid-state light sources 11a in the PWM control period of the solid-state light source array 11, is determined using the table T1. It should be noted that it is assumed here that the target light intensity represented by the target light intensity signal S1 is 80% of the highest light intensity, which can be emitted from the solid-state light source array 11, and the duty ratio is determined to be 80% using the table T1 described above.

The duty ratio determined by the duty ratio determination section 2 is output to the PWM signal generation section 3, and the PWM signals S11 through S14 for driving the plurality of solid-state light sources 11a provided to the solid-state light source array 11 are generated based on the duty ratio. Specifically, there are generated the PWM signals S11 through S14 having the frequency equal to the PWM control frequency described above, the duty ratio determined by the duty ratio determination section 2, and the phases 90 degrees different from each other.

The PWM signals S11 through S14 generated by the PWM signal generation section 3 are respectively output to the light source drive sections 4a through 4d, and the drive signals D1 through D4 for driving the plurality of solid-state light sources 11a provided to the solid-state light source array 11 for each of the columns C1 through C4 are generated respectively. These drive signals D1 through D4 are supplied to the solid-state light source array 11, and the emission and the extinction of the plurality of solid-state light sources 11a provided to the solid-state light source array 11 are performed for each of the columns C1 through C4.

Figure 2:
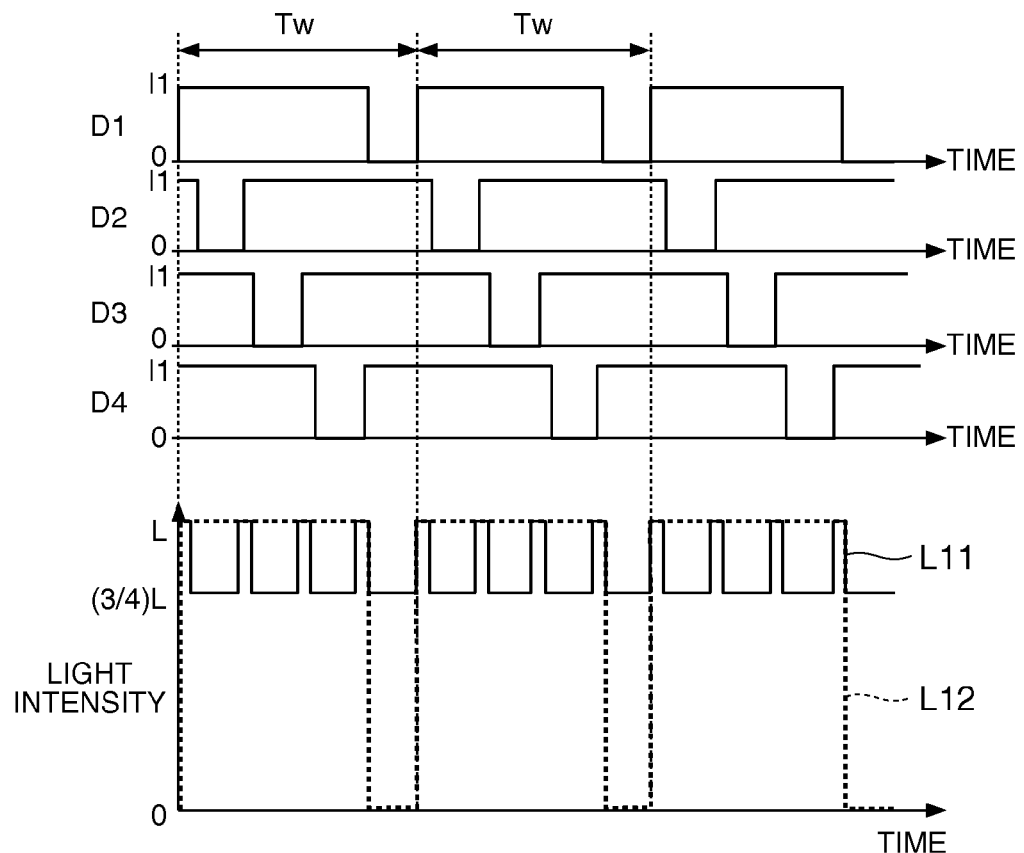
FIG. 2 is a diagram showing a relationship between a drive signal and a light output in the first embodiment of the invention.

FIG. 2 is a diagram showing a relationship between the drive signal and a light output in the first embodiment of the invention. As shown in FIG. 2, the drive signals D1 through D4 supplied from the light source drive sections 4a through 4d to the solid-state light source array 11 are signals having the period Tw equal to the PWM control period described above, and the duty ratio of 80%, taking either one of the binary current values of 0 [A] and I1 [A], and having the phases 90 degrees different from each other.

Here, if it is assumed that the phases of the drive signals D2 through D4 coincide with the phase of the drive signal D1, the light having the light intensity varying along the curve L12 shown in FIG. 2 is emitted from the solid-state light source array 11. In other words, the light having the highest light intensity of L, and the time variation of the light intensity similar to the time variation of the drive signal D1 is emitted from the solid-state light source array 11. The flicker caused in the case in which such light is emitted from the solid-state light source array 11 mainly has the frequency component of the PWM control frequency, which is equal to the frequency of the drive signal D1.

In contrast, as shown in FIG. 2, in the case in which the drive signals D1 through D4 having the phases 90 degrees different from each other are supplied to the solid-state light source array 11, the light having the light intensity varying along the curve L11 shown in FIG. 2 is emitted from the solid-state light source array 11. In other wards, the light having the light intensity varying between 3 L/4 and L as much as L/4 at the period (Tw/4) one-fourth as long as the period Tw of the drive signals D1 through D4. The flicker caused in the case in which such light is emitted from the solid-state light source array 11 mainly has the frequency component of the frequency (the frequency four times as high as the PWM control frequency) four times as high as that of the drive signal D1.

As described above, if the solid-state light source array 11 is driven by the drive signals D1 through D4 having the phases 90 degrees different from each other, the light intensity variation of the light emitted therefrom can be reduced to one-fourth, and at the same time, the frequency component of the flicker can be raised to four times the frequency compared to the case in which the solid-state light source array 11 is driven by the drive signals with the same phase. Therefore, even in the case in which the light emitted from the solid-state light source array 11 is modulated by the light modulation device such as a light valve, the generation of the flicker and the scroll noise can be reduced without much affected by the characteristics of the light modulation device.

Although the case in which the duty ratio determined by the duty ratio determination section 2 is 80% is hereinabove explained, if the duty ratio determined by the duty ratio determination section 2 is either of 75%, 50%, and 25%, the flicker can completely be eliminated. Thus, since the interference between the flicker of the light modulation device and the flicker of the solid-state light source array 11 does not occur even if the light emitted by the solid-state light source array 11 is modulated by the light modulation device such as a light valve, the flicker and the scroll noise can be prevented from occurring.

Second Embodiment

Figure 3:
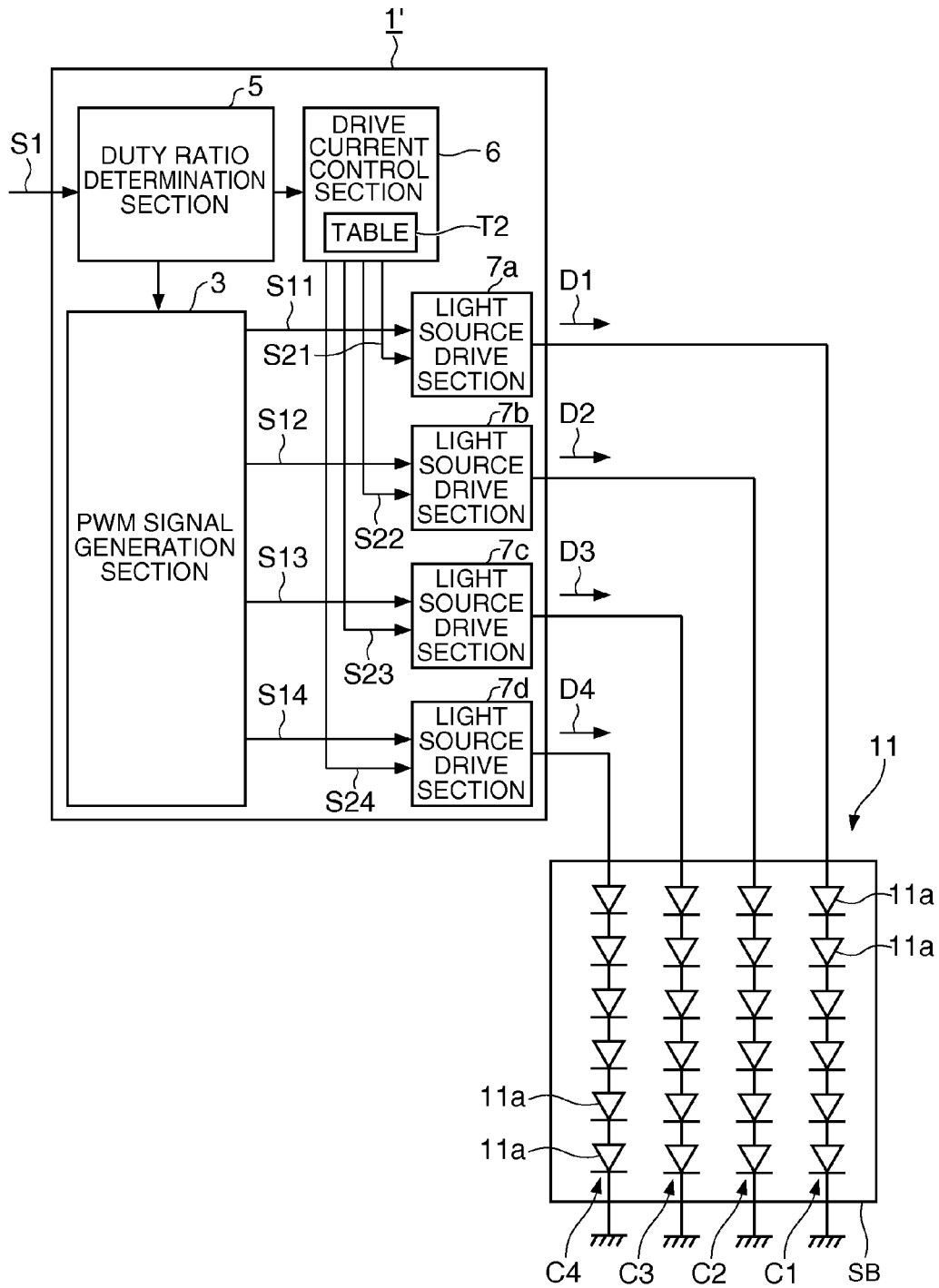
FIG. 3 is a block diagram showing a configuration of a substantial part of a light source control device according to a second embodiment of the invention.

FIG. 3 is a block diagram showing a configuration of a substantial part of a light source control device according to a second embodiment of the invention. As shown in FIG. 3, the light source control device 1' according to the present embodiment has the configuration obtained by adding a drive current control section 6 (a current control section) to the light source control device 1 shown in FIG. 1, replacing the duty ratio determination section 2 with a duty ratio selection section 5 (the determination section), and replacing the light source drive sections 4a through 4d with light source drive sections 7a through 7d (the drive control section). The light source control device 1' having such a configuration is capable of varying the current values of the drive signals D1 through D4 to be supplied to the solid-state light source array 11 in accordance with the duty ratio selected by the duty ratio selection section 5.

The duty ratio selection section 5 selects the duty ratio from 0%, 25%, 50%, 75%, and 100% in accordance with the target light intensity represented by the target light intensity signal S1. For example, if the target light intensity represented by the target light intensity signal S1 is 60% of the highest light intensity set previously, the duty ratio selection section 5 selects the duty ratio of 75%. In other words, although the duty ratio determination section 2 shown in FIG. 1 is for finely determining the duty ratio corresponding to the target light intensity signal using the table T1, the duty ratio selection section 5 according to the present embodiment is for roughly determining the duty ratio by selecting either one of the duty ratios described above in accordance with the target light intensity represented by the target light intensity signal S1.

The drive current control section 6 outputs control signals S21 through S24 for controlling the currents of the drive signals D1 through D4 to be supplied to the solid-state light source array 11 based on the target light intensity signal S1 and the duty ratio selected by the duty ratio selection section 5. Specifically, the drive current control section 6 has a table T2 (a second table) representing the relationship between the light intensity of the light emitted by the solid-state light source array 11, the duty ratio, and the current supplied to the solid-state light source array 11, and outputs the control signals S21 through S24 for controlling the currents of the drive signals D1 through D4 to be the currents corresponding to the target light intensity signal S1 and the duty ratio using the table T2.

The control signals S21 through S24 generated by the drive current control section 6 are for generally increasing the current values of the drive signals D1 through D4 as the target light intensity represented by the target light intensity signal S1 rises, or the duty ratio is lowered. For example, in the case in which the target light intensity represented by the target light intensity signal S1 is 60% of the highest light intensity set previously, and the duty ratio selected by the duty ratio selection section 5 is 75%, the drive current control section 6 outputs the control signals S21 through S24 for controlling the current values of the drive signals D1 through D4 to be 80% of the current value supplied when the light with the highest light intensity is emitted from the solid-state light source array 11.

The light source drive sections 7a through 7d respectively generate the drive signals D1 through D4 for driving the plurality of solid-state light sources 11a provided to the solid-state light source array 11 for each of the columns C1 through C4 based on the PWM signals S11 through S14 generated by the PWM signal generation section 3 and the control signals S21 through S24 generated by the drive current control section 6. It should be noted that the drive signals D1 through D4 are pulsed signals having the frequencies, the duty ratios, and the phases respectively defined based on the PWM signals S11 through S14, and the current values set when the signal level of the corresponding PWM signals S11 through S14 is in the "H" level defined based on the control signals S21 through S24.

Then, the operation of the light source control device 1' in the configuration described above will be explained. When the target light intensity signal S1 from the outside is input to the light source control device 1, the signal is input to the duty ratio selection section 5, and the duty ratio corresponding to the target light intensity represented by the target light intensity signal S1 is selected. It should be noted that it is assumed here that the target light intensity represented by the target light intensity signal S1 is 60% of the highest light intensity, which can be emitted from the solid-state light source array 11, and the duty ratio of 75% is selected.

The duty ratio selected by the duty ratio selection section 5 is output to the PWM signal generation section 3, and the PWM signals S11 through S14 for driving the plurality of solid-state light sources 11a provided to the solid-state light source array 11 are generated based on the duty ratio. Specifically, there are generated the PWM signals S11 through S14 having the frequency equal to the PWM control frequency described above, the duty ratio selected by the duty ratio selection section 5, and the phases 90 degrees different from each other.

Concurrently therewith, the target light intensity signal S1 and the duty ratio selected by the duty ratio selection section 5 are input to the drive current control section 6, and then the control signals S21 through S24 for controlling the currents of the drive signals D1 through D4 to be supplied to the solid-state light source array 11 are generated and then output. It should be noted that it is assumed here that the control signals S21 through S24 for controlling the current values of the drive signals D1 through D4 to be 80% of the current values, which are supplied when the light with the highest light intensity is output from the solid-state light source array 11, are output.

The PWM signals S11 through S14 generated by the PWM signal generation section 3 and the control signals S21 through S24 generated by the drive current control section 6 are respectively output to the light source drive sections 7a through 7d, and the drive signals D1 through D4 for driving the plurality of solid-state light sources 11a provided to the solid-state light source array 11 for each of the columns C1 through C4 are generated respectively. These drive signals D1 through D4 are supplied to the solid-state light source array 11, and the emission and the extinction of the plurality of solid-state light sources 11a provided to the solid-state light source array 11 are performed for each of the columns C1 through C4.

Figure 4:
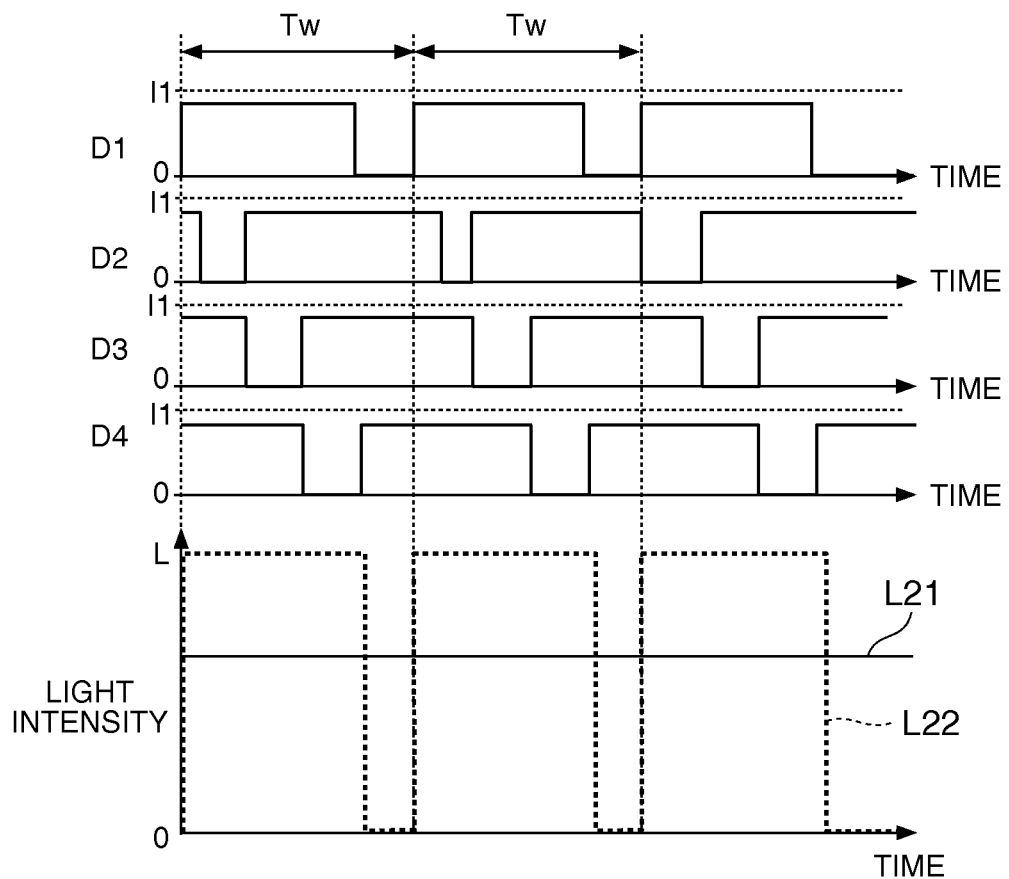
FIG. 4 is a diagram showing a relationship between a drive signal and a light output in the second embodiment of the invention.

FIG. 4 is a diagram showing a relationship between the drive signal and a light output in the second embodiment of the invention. As shown in FIG. 4, the drive signals D1 through D4 supplied from the light source drive sections 7a through 7d to the solid-state light source array 11 are signals having the period Tw equal to the PWM control period described above, and the duty ratio of 75%, and having the phases 90 degrees different from each other. It should be noted that the current values thereof are controlled by the control signals S21 through S24 from the drive current control section 6 so that the maximum value becomes 80% of the I1[A].

Here, if it is assumed that the phases of the drive signals D2 through D4 coincide with the phase of the drive signal D1, and the maximum value of each of the drive signals D1 through D4 is I1[A], the light having the light intensity varying along the curve L22 shown in FIG. 4 is emitted from the solid-state light source array 11. In other words, the light having the highest light intensity of L, and the time variation of the light intensity similar to the time variation of the drive signal D1 is emitted from the solid-state light source array 11. The flicker caused in the case in which such light is emitted from the solid-state light source array 11 mainly has the frequency component of the PWM control frequency, which is equal to the frequency of the drive signal D1.

In contrast, as shown in FIG. 4, in the casein which the drive signals D1 through D4, which have the phases 90 degrees different from each other, and the maximum value controlled to be 80% of the I1[A], are supplied to the solid-state light source array 11, the light having the constant light intensity is emitted from the solid-state light source array 11 as indicated by the curve L21 in FIG. 4. Specifically, the light is emitted, which has the light intensity 60% of the highest light intensity L, and does not cause time fluctuation of the light intensity.

As described above, also in the present embodiment, the duty ratio is set to 75% and the flicker can completely be eliminated by driving the solid-state light source array 11 with the drive signals D1 through D4 having the phases 90 degrees different from each other. Thus, since the interference between the flicker of the light modulation device and the flicker of the solid-state light source array 11 does not occur even if the light emitted by the solid-state light source array 11 is modulated by the light modulation device such as a light valve, the flicker and the scroll noise can be prevented from occurring.

In the description of the first and second embodiments, there is explained the example in which the solid-state light sources 11a of the solid-state light source array 11 are sectioned into the four columns C1 through C4, and the duty ratios are determined using the table T1 or the duty ratios are selected while controlling the current using the table T2. However, if the characteristics (the characteristics between the current and the light intensity and the characteristics between the duty ratio and the light intensity) of the solid-state light sources 11a provided to the solid-state light source array 11 are linear, the determination of the duty ratios and the current control can be performed by calculation without using the tables T1, T2.

Specifically, assuming that the solid-state light sources 11a provided to the solid-state light source array 11 are sectioned into n (n denotes an integer equal to or greater than 2) blocks, and the target light intensity represented by the target light intensity signal S1 is m % (m denotes a number fulfilling 0≤m≤100) of the highest light intensity set previously, the duty ratio D % can be determined based on the following formula.

$$D = a \times (100/n)$$

It should be noted that the variable a in the formula denotes the value obtained by rounding up the value obtained by the expression of m/(100/n) to the whole number.

On this occasion, the control signals generated by the PWM signal generation section 3 are n control signals having the period Tw equal to the PWM control period, and the respective phases shifted 360/n degree(s) from each other. Further, in the second embodiment, the maximum value of each of the drive signals D1 through D4 supplied to the solid-state light source array 11 is controlled by the drive current control section 6 so as to be (m/D)×100% of I1 [A] (the current supplied to the solid-state light source array 11 when the target light intensity is 100%).

Third Embodiment

Figure 5:
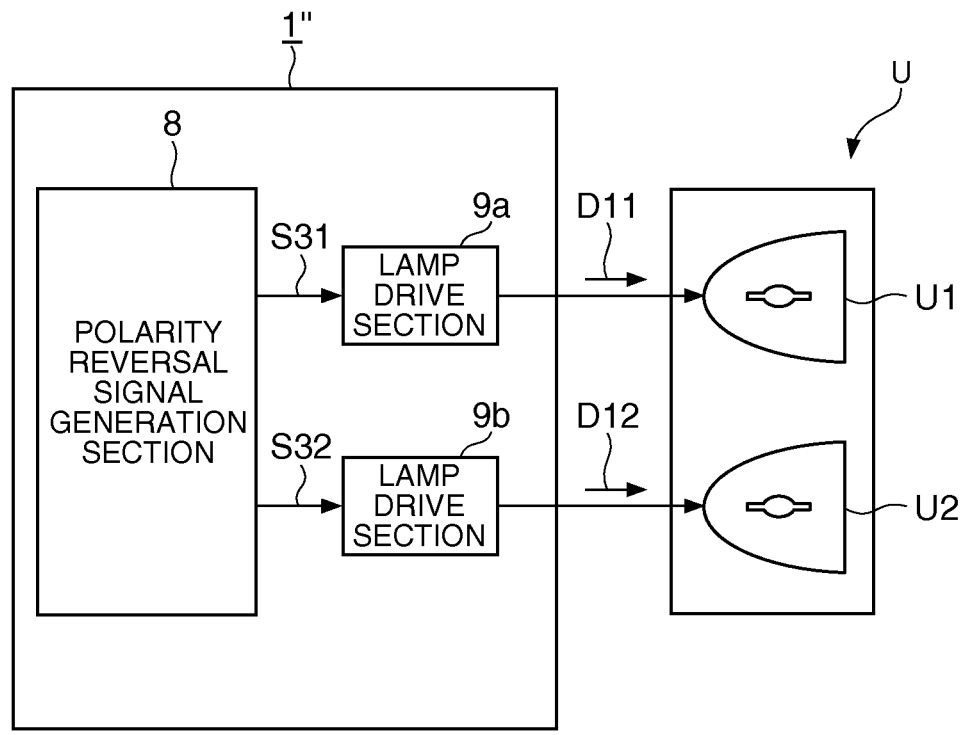
FIG. 5 is a block diagram showing a configuration of a substantial part of a light source control device according to a third embodiment of the invention.

FIG. 5 is a block diagram showing a configuration of a substantial part of a light source control device according to a third embodiment of the invention. As shown in FIG. 5, the light source control device 1" according to the present embodiment is provided with a polarity reversal signal generation section 8 (the drive control section) and lamp drive sections 9a, 9b, and controls drive of the lamp unit U (the light source device) having a plurality of lamps U1, U2 while reversing the polarity of the applied voltage.

The light source control devices 1, 1' of the first and second embodiments are for controlling the solid-state light sources 11a on which instant lighting and instant extinction can be performed. In contrast thereto, the light source control device 1" according to the present embodiment is for controlling the lamps U1, U2 requiring several minutes of time for relighting after once put off. The lamps U1, U2 provided to the lamp unit U are discharge lamps such as super-high pressure mercury lamps.

The polarity reversal signal generation section 8 provided to the light source control device 1″ generates polarity reversal signals S31, S32 (the control signals) for reversing the polarities of the respective drive signals D11, D12 supplied to the lamp unit U. Specifically, the polarity reversal signal generation section 8 generates the polarity reversal signals S31, S32 having the frequencies defined to be the control frequency at which the polarities of the lamps U1, U2 are reversed, and the phases 90 degrees different from each other. Here, the reason for making the phases of the polarity reversal signals S31, S32 different as much as 90 degrees is to raise the frequency component of the flicker of the light emitted from the lamp unit U.

The lamp drive sections 9a, 9b generate the drive signals D11, D12 for driving the lamps U1, U2 based on the polarity reversal signals S31, S32, generated by the polarity reversal signal generation section 8, respectively. Here, the lamp drive sections 9a, 9b respectively generate the drive signals D11, D12 having the voltages raised to some extent until the timing at which the polarity reversal is performed. This is because it is required to raise the voltage to some extent prior to the polarity reversal in order for reversing the polarities of the lamps U1, U2. It should be noted that the way of raising the voltage is arbitrary. It is possible, for example, to raise the voltage at the timing immediately before the polarity reversal is performed in a pulsed manner, or to raise the voltage in a triangular wave manner.

Figure 6:
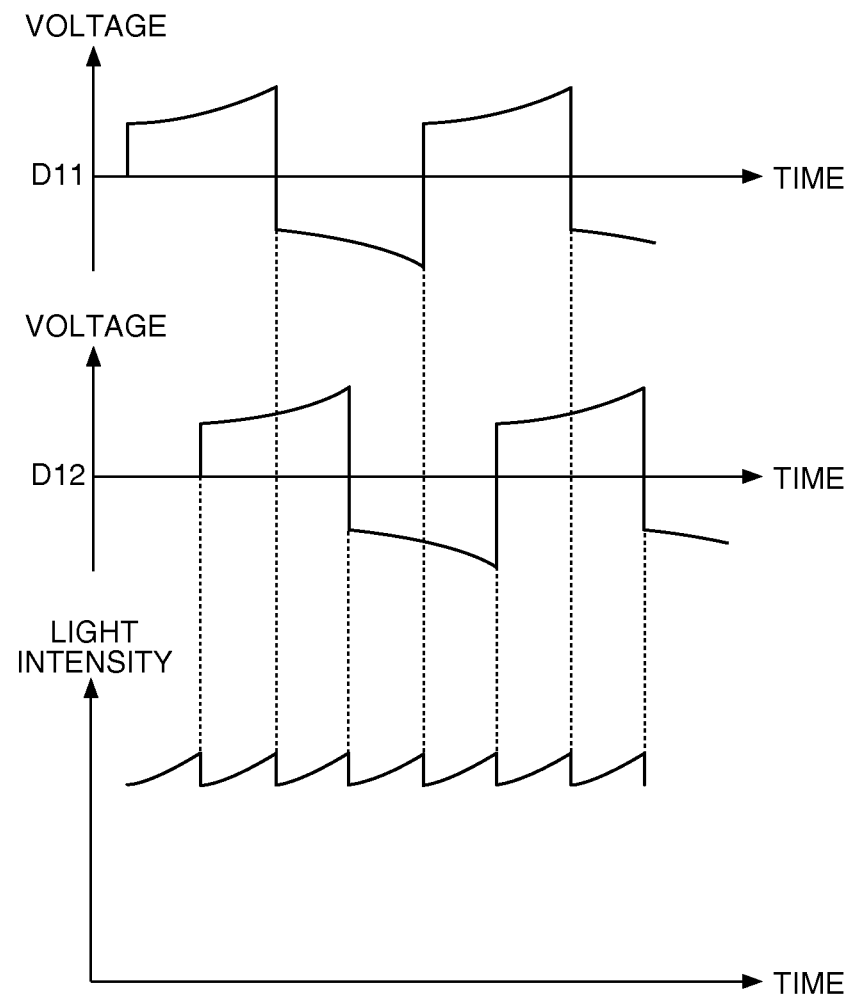
FIG. 6 is a diagram showing a relationship between a drive signal and a light output in the third embodiment of the invention.

FIG. 6 is a diagram showing a relationship between the drive signal and a light output in the third embodiment of the invention. As shown in FIG. 6, the drive signals D11, D12 supplied from the lamp drive sections 9a through 9d to the lamp unit U are signals having the frequencies equal to the control frequency at which the polarities of the lamps U1, U2 are reversed, and the phases 90 degrees different from each other. It should be noted that the drive signals D11, D12 are both the signals each having the voltage gradually rising in a curved manner from the time point of polarity reversal to the time point of subsequent polarity reversal.

With reference to FIG. 6, it is understood that the light intensity of the light emitted from the lamp unit U varies discontinuously at the timing at which the polarities of the drive signals D11, D12 are reversed. It should be noted that although not shown clearly in FIG. 6, the variation of the light intensity becomes smaller than the variation in the case of making the phases of the drive signals D11, D12 coincide with each other. Further, it is understood that the period (the frequency) at which the light intensity of the light emitted from the lamp unit U varies is a half (two times) of the period (the frequency) of the drive signals D11, D12.

As described above, also in the present embodiment, the variation of the light intensity at the polarity reversal can be reduced, and at the same time, the frequency at which the light intensity varies can be doubled similarly to the first embodiment. Therefore, even in the case in which the light emitted from the lamp unit U is modulated by the light modulation device such as a light valve, the generation of the flicker and the scroll noise can be reduced without much affected by the characteristics of the light modulation device.

Projector

Figure 7:
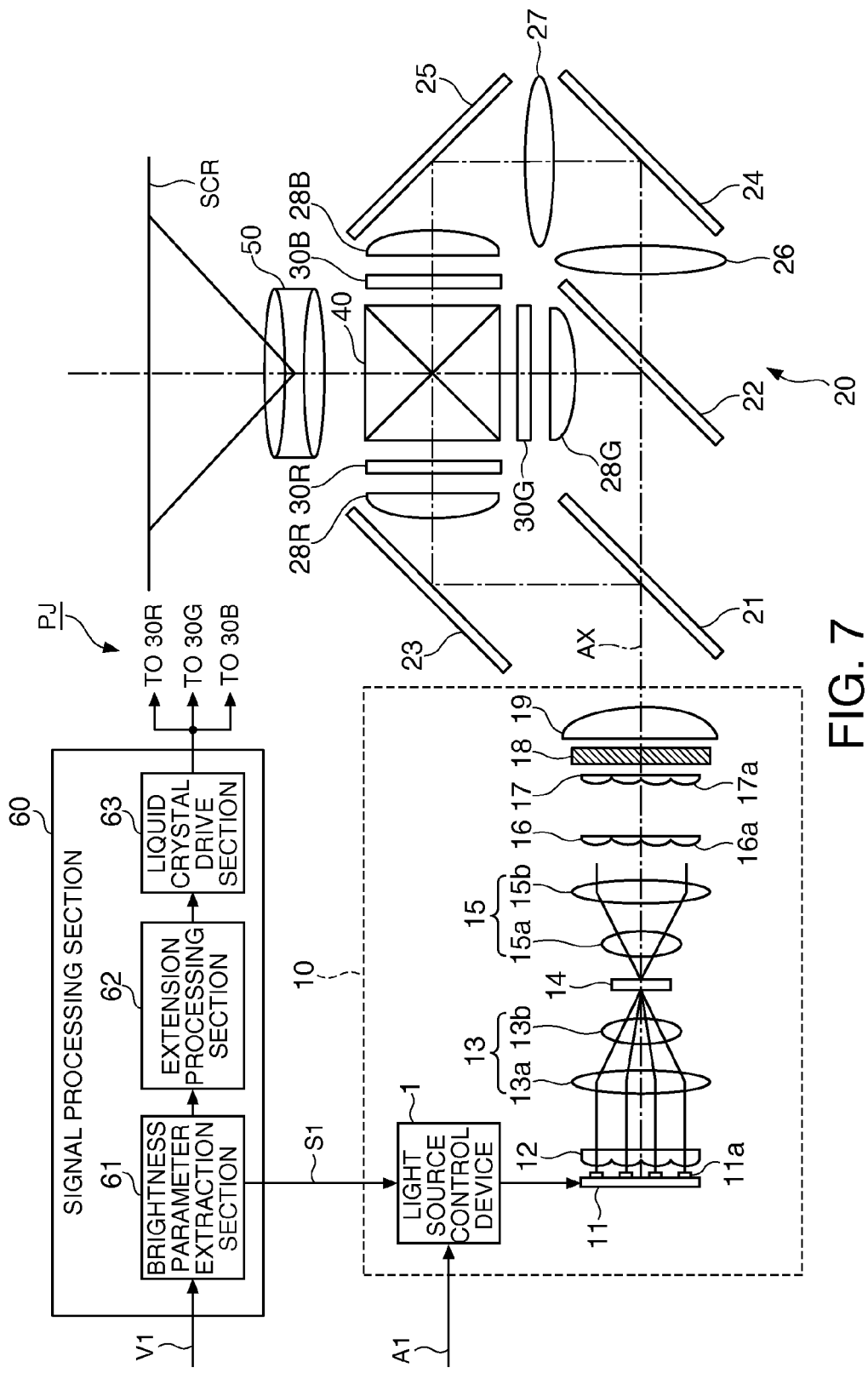
FIG. 7 is a diagram showing a configuration of a projector according to an embodiment of the invention.

Then, a projector according to an embodiment of the invention will be explained. It should be noted that the explanation will hereinafter be presented citing the projector equipped with the light source control device 1 explained with reference to FIG. 1 as an example. FIG. 7 is a diagram showing a configuration of the projector according to the embodiment of the invention. As shown in FIG. 7, the projector PJ is provided with an illumination device 10, a color separation light guide optical system 20, liquid crystal light modulation devices 30R, 30G, and 30B (light modulation devices), a cross dichroic prism 40, a projection optical system 50, and a signal processing section 60, and projects image light corresponding to an image signal V1 input from the outside to thereby display the image on a screen SCR.

The illumination device 10 is provided with the light source control device 1 and the solid-state light source array 11 shown in FIG. 1, a collimator lens array 12, a light collection optical system 13, a fluorescence generation section 14, a collimator optical system 15, a first lens array 16, a second lens array 17, a polarization conversion element 18, and an overlapping lens 19, and emits white light including red light, green light, and blue light. The collimator lens array 12 is provided with a plurality of collimator lenses respectively corresponding to the plurality of solid-state light sources 11a provided to the solid-state light source array 11, and roughly collimates the blue light emitted from each of the solid-state light sources 11a.

Specifically, the collimator lens array 12 is composed of 24 collimator lenses each formed of a planoconvex lens arranged in a 6×4 matrix. The collimator lens array 12 is disposed in a condition of having the convex surfaces of the collimator lenses opposed to the solid-state light source array 11, and the collimator lenses corresponding respectively to the solid-state light sources 11a. The light collection optical system 13 is provided with a first lens 13a and a second lens 13b, and focuses the blue light roughly collimated by the collimator lens array 12 at a position adjacent to the fluorescence generation section 14.

The fluorescence generation section 14 is disposed in the vicinity of the focus position of the light collection optical system 13, and has a fluorescent layer (not shown) for generating a fluorescence including the red light and the green light from some of the blue light collected by the light collection optical system 13, and a transparent member (not shown) for supporting the fluorescent layer. Specifically, the fluorescence generation section 14 is disposed at a position where the blue light collected by the light collection optical system 13 enters the fluorescent layer in a defocused state. The fluorescence generation section 14 emits the light including the blue light, which is transmitted through the fluorescent layer without being involved in the generation of the fluorescence, together with the fluorescence, and appearing white light as a whole.

The fluorescent layer described above is formed of a layer including, for example, $(Y, Gd)_3(Al, Ga)_5O_{12}$:Ce as a YAG fluorescent material. The fluorescent layer converts some of the blue light collected by the light collection optical system 13 into the fluorescence including the red light (having the emission intensity peak at around 610 nm) and the green light (having the emission intensity peak at around 550 nm), and then emits the fluorescence. It should be noted that among the blue light, some blue light transmitted through the fluorescent layer without being involved in the generation of the fluorescence is emitted together with the fluorescence. The collimator optical system 15 is provided with a first lens 15a and a second lens 15b, and roughly collimates the light from the fluorescence generation section 14.

The first lens array 16 has a plurality of small lenses 16a, and divides the light from the solid-state light source array 11 into a plurality of partial light beams. Specifically, the plurality of small lenses 16a provided to the first lens array 16 is arranged in a matrix composed of a plurality of rows and a plurality of columns in a plane perpendicular to an illumination light axis AX. It should be noted that the outer shape of the plurality of small lenses 16a provided to the first lens array 16 is a roughly similar shape with respect to the outer shape of the image forming area of each of the liquid crystal light modulation devices 30R, 30G, and 30B.

The second lens array 17 has a plurality of small lenses 17a corresponding to the small lenses 16a provided to the first lens array 16. Specifically, the plurality of small lenses 17a provided to the second lens array 17 are arranged in a matrix composed of a plurality of rows and a plurality of columns in a plane perpendicular to the illumination light axis AX similarly to the plurality of small lenses 16a provided to the first lens array 16. The second lens array 17 images the image of each of the small lenses 16a of the first lens array 16 in the vicinity of the image forming area of each of the liquid crystal light modulation devices 30R, 30G, and 30B in cooperation with the overlapping lens 19.

The polarization conversion element 18 has a polarization separation layer, a reflecting layer, and a retardation plate (none of them shown), and converts each of the partial light beams, which are split into by the first lens array 16, into a substantially unique linearly polarized light beam having a uniform polarization direction, and emits the resulted partial light beams. Here, the polarization separation layer transmits one of the linearly polarized components included in the light from the solid-state light source array 11 without modification, and reflects the other of the linearly polarized components in a direction perpendicular to the illumination light axis AX. Further, the reflecting layer reflects the other of the linearly polarized components, which are reflected by the polarization separation layer, in a direction parallel to the illumination light axis AX. Further, the retardation plate converts the other of the linearly polarized components reflected by the reflecting layer into the one of the linearly polarized components.

The overlapping lens 19 is disposed so that the optical axis thereof coincides with the optical axis of the illumination device 10, and collects the partial light beams from the polarization conversion element 18 to make the partial light beams overlap each other in the vicinity of the image forming area of each of the liquid crystal light modulation devices 30R, 30G, and 30B. The first lens array 16, the second lens array 17, and the overlapping lens 19 described above constitute a lens integrator optical system for homogenizing the light from the solid-state light source array 11.

The color separation light guide optical system 20 is provided with dichroic mirrors 21, 22, reflecting mirrors 23 through 25, relay lenses 26, 27, and collecting lenses 28R, 28G, and 28B, and separates the light from the illumination device 10 into the red light, the green light, and the blue light, and then guides them to the liquid crystal light modulation devices 30R, 30G, and 30B, respectively. The dichroic mirrors 21, 22 are mirrors each having a wavelength selecting transmissive film, which reflects the light in a predetermined wavelength band and transmits the light in another wavelength band, formed on a transparent substrate. Specifically, the dichroic mirror 21 reflects the red light component and transmits the green light component and the blue light component, and the dichroic mirror 22 reflects the green light component and transmits the blue light component.

The reflecting mirror 23 is a mirror for reflecting the red light component, while the reflecting mirrors 24, 25 are mirrors for reflecting the blue light component. The relay lens 26 is disposed between the dichroic mirror 22 and the reflecting mirror 24, and the relay lens 27 is disposed between the reflecting mirror 24 and the reflecting mirror 25. Since the length of the light path of the blue light is larger than the length of the light paths of other colored lights, the relay lenses 26, 27 are provided in order for preventing the degradation of the light efficiency due to the diffusion of the light. The collecting lenses 28R, 28G, and 28B collect the red light component reflected by the reflecting mirror 23, the green light component reflected by the dichroic mirror 22, and the blue light component reflected by the reflecting mirror 25 in the image forming areas of the liquid crystal light modulation devices 30R, 30G, and 30B, respectively.

The red light reflected by the dichroic mirror 21 is reflected by the reflecting mirror 23, and enters the image forming area of the liquid crystal light modulation device 30R for the red light via the collecting lens 28R. The green light having passed through the dichroic mirror 21 is reflected by the dichroic mirror 22, and then enters the image forming area of the liquid crystal light modulation device 30G for the green light via the collecting lens 28G. The blue light having passed through the dichroic mirrors 21, 22 enters the image forming area of the liquid crystal light modulation device 30B for the blue light after sequentially passing through the relay lens 26, the reflecting mirror 24, the relay lens 27, the reflecting mirror 25, and the collecting lens 28B.

The liquid crystal light modulation devices 30R, 30G, and 30B modulate the colored lights input therein in accordance with the image signal output from the signal processing section 60, and generate the red image light, the green image light, and the blue image light, respectively. It should be noted that, although omitted from FIG. 7, the entrance side polarization plates are disposed between the collecting lenses 28R, 28G, and 28B and the liquid crystal light modulation devices 30R, 30G, and 30B, respectively, so as to intervene therebetween, and the exit side polarization plates are disposed between the liquid crystal light modulation devices 30R, 30G, and 30B, and the cross dichroic prism 40, respectively, so as to intervene therebetween.

The liquid crystal light modulation devices 30R, 30G, and 30B are each a transmissive liquid crystal light modulation device having the liquid crystal as an electro-optic material airtightly encapsulated between a pair of transparent glass substrates, and are each provided with, for example, polysilicon thin film transistors (TFT) as the switching elements. The polarization directions of the colored lights (the linearly polarized lights) via the entrance side polarization plates not shown described above are modulated by the switching operations of the switching elements provided to the liquid crystal light modulation devices 30R, 30G, and 30B, thereby generating the red image light, the green image light, and the blue image light corresponding to the image signal, respectively.

The cross dichroic prism 40 combines the image lights emitted from the respective exit side polarization plates not shown described above to thereby form the color image. Specifically, the cross dichroic prism 40 is an optical member having a substantially cubic shape composed of four rectangular prisms bonded to each other, and on the substantially X-shaped interfaces on which the rectangular prisms are bonded to each other, there are formed dielectric multilayer films. The dielectric multilayer film formed on one of the substantially X-shaped interfaces is for reflecting the red light, and the dielectric multilayer film formed on the other of the interfaces is for reflecting the blue light. The red light and the blue light are bent by these dielectric multilayer films to have the proceeding direction aligned with the proceeding direction of the green light, thus the three colored lights are combined with each other. The projection optical system 50 projects the color image combined by the cross dichroic prism 40 toward the screen SCR in an enlarged manner.

The signal processing section 60 is provided with a brightness parameter extraction section 61 (a target light intensity calculation section), an extension processing section 62, and a liquid crystal drive section 63, and performs signal processing on an image signal V1 externally input thereto to thereby generate the target light intensity signal S1 used in the light source control device 1 and the image signals used in the liquid crystal light modulation devices 30R, 30G, and 30B.

The brightness parameter extraction section 61 extracts the brightness parameter as the information expressing a representative value of the brightness of the image to be displayed based on the image signal V1. For example, the brightness parameter extraction section 61 divides the image signal V1 into a plurality of blocks (e.g., the blocks composed of 4×4 pixels), calculates the average value of the brightness of the pixels included in each of the blocks, and then extracts the maximum value of the average values as the brightness parameter. The brightness parameter is output to the light source control device 1 provided to the illumination device 10 as the target light intensity signal S1. Here, as shown in FIG. 7, a control signal A1 for controlling the white balance is also input to the light source control device 1 (to be precise, the duty ratio determination section 2 provided to the light source control device 1) besides the target light intensity signal S1 from the brightness parameter extraction section 61.

The extension processing section 62 performs an extension process on the image signal V1 externally input thereto based on the brightness parameter extracted by the brightness parameter extraction section 61. In the case, for example, in which the number of grayscale levels of the image which can be displayed based on the image signal V1 is 255, and the brightness parameter thus extracted indicates the brightness corresponding to 200th level of the grayscale, the extension processing section 62 performs the process of multiplying the image signal V1 by a coefficient $\alpha=(255/200)$. By performing such an extension process, display of a high-contrast image making the maximum use of the dynamic range of the liquid crystal light modulation devices 30R, 30G, and 30B becomes possible. The liquid crystal drive section 63 generates the drive signals for driving the respective liquid crystal light modulation devices 30R, 30G, and 30B from the image signal on which the extension process is performed by the extension processing section 62.

When the image signal V1 is input to the projector PJ having the configuration described above, the brightness parameter is extracted by the brightness parameter extraction section 61 of the signal processing section 60, and is then output to the light source control device 1 as the target light intensity signal S1. When the target light intensity signal S1 is input to the light source control device 1, the determination of the duty ratio using the table T1, the generation of the PWM signals S11 through S14, and the generation of the drive signals S1 through S4 are performed, and the solid-state light source array 11 is driven, as described above.

On the other hand, the brightness parameter extracted by the brightness parameter extraction section 61 is output to the extension processing section 62 together with the image signal V1, and then the extension process of the image signal V1 is performed in the extension processing section 62. Further, the drive signals are generated in the liquid crystal drive section 63 based on the image signal on which the extension process is performed, and thus the liquid crystal light modulation devices 30R, 30G, and 30B are driven.

Here, the projector PJ according to the present embodiment is provided with the light source control device 1 capable of reducing the light intensity variation of the light emitted from the solid-state light source array 11, and at the same time, raising the frequency component of the flicker to four times as high as before, or completely eliminating the flicker of the light emitted from the solid-state light source array 11. Therefore, even if the light emitted from the solid-state light source array 11 is modulated by the liquid crystal light modulation devices 30R, 30G, and 30B, generation of the flicker and the scroll noise can be reduced or prevented without being affected by the characteristics of the liquid crystal light modulation devices 30R, 30G, and 30B.

It should be noted that reduction of the light intensity variation and the raise in the frequency component of the flicker can also be achieved in the case of the configuration provided with the light source control device 1' instead of the light source control device 1, or in the case of the configuration in which the lamp unit U is provided instead of the solid-state light source array 11 and the collimator lens array 12, and the light source control device 1" is provided instead of the light source control device 1. Therefore, the generation of the flicker and the scroll noise can be reduced or prevented without being affected by the characteristics of the liquid crystal light modulation devices 30R, 30G, and 30B also in the cases of such configurations.

Although the light source control device, the light source control method, and the projector according to the embodiments of the invention are hereinabove explained, the invention is not limited to the embodiments described above, but can freely be modified within the scope or the sprit of the invention. The modified examples described hereinafter, for example, are possible.

1. Although in the embodiments described above, the case in which the solid-state light sources 11a formed to have an arrangement of the solid-state light source array 11 are the semiconductor lasers is explained as an example, the invention is not limited thereto. The invention can also be applied to the solid-state light source array having the solid-state light sources formed of light emitting diodes.

2. Although in the embodiments described above the example of arranging the solid-state light sources in a sheet is explained, the invention is not limited thereto. The invention can also be applied to the case, for example, in which the solid-state light sources are arranged linearly. In addition, although in the embodiments described above the example of arranging the solid-state light sources in the vertical direction and the lateral direction of the substrate SB at regular intervals is explained, the solid-state light sources can also be arranged in a honeycomb pattern. Here, the honeycomb pattern denotes the arrangement in which the solid-state light source is located at each of the intersections of the regular hexagons arranged tightly.

3. Although in the embodiments described above, the transmissive projector is explained as an example of the projector, the invention is not limited thereto. The invention can also be applied to, for example, a reflective projector. It should be noted here that "transmissive" denotes that the light modulation device is a type of transmitting the light such as a transmissive liquid crystal display device, and "reflective" denotes that the light modulation device is a type of reflecting the light such as a reflective liquid crystal display device. Also in the case in which the invention is applied to the reflective projector, the same advantages as in the case with the transmissive projector can be obtained.

4. Although in the embodiments described above the example of using the liquid crystal light modulation devices as the light modulation devices is explained, the invention is not limited thereto. Any devices for modulating the incident light in accordance with the image signal, in general, can be adopted as the light modulation devices, and the light valves, the micromirror light modulation devices, and so on can also be adopted. As the micromirror light modulation device, for example, a digital micromirror device (DMD, a trademark of Texas Instruments) can be used.

5. The invention can be applied to a front projection projector for performing projection from the side of observing the projection image, and also to a rear projection projector for performing projection from the side opposite to the side of observing the projection image.

The entire disclosure of Japanese Patent Application No. 2010-235475, filed Oct. 20, 2010 is expressly incorporated by reference herein.

What is claimed is:

1. A light source control device adapted to control a light source device having a plurality of solid-state light sources, the light source control device comprising:
    a determination section adapted to determine a duty ratio, which is a ratio between an emission time period and an extinction time period of the solid-state light sources in a control period of the light source device, based on an information representing a target light intensity, which is a light intensity of light required to be emitted from the light source device;
    a drive control section adapted to generate a control signal having the duty ratio determined by the determination section, and adapted to make a phase with which at least one of the solid-state light sources is driven different from a phase with which another of the solid-state light sources is driven, thereby performing drive control of the plurality of solid-state light sources; and
    a current control section adapted to control a current supplied to the solid-state light sources in accordance with the target light intensity and the duty ratio determined by the determination section,
    wherein the current control section has a second table representing a relationship between the light intensity of the light emitted from the light source device, the duty ratio, and the current supplied to the solid-state light sources, and supplies the solid-state light sources with the current corresponding to the target light intensity and the duty ratio using the second table.

2. The light source control device according to claim 1, wherein
    the determination section has a first table representing a relationship between the light intensity of the light emitted from the light source device and the duty ratio, and determines the duty ratio corresponding to the target light intensity using the first table.

3. The light source control device according to claim 1, wherein
    the plurality of solid-state light sources are sectioned into n blocks lighting and extinction of which can be controlled individually, wherein n denotes an integer one of equal to and greater than two,
    the determination section determines the duty ratio D % to be a value obtained by a formula of $a \times (100/n)$ assuming that the target light intensity is denoted by m %, and a value obtained by rounding up a value obtained by a formula of $m/(100/n)$ to the whole number is denoted by a, wherein m denotes a number fulfilling $0 \leq m \leq 100$,
    the drive control section generates n control signals having respective phases shifted $360/n$ degree(s) from each other, and
    the current control section controls the current supplied to the solid-state light sources to be $(m/D) \times 100\%$ of a current, which is supplied to the solid-state light sources when the target light intensity is 100%.

4. A projector comprising:
    a light source device;
    a light modulation device adapted to modulate a light from the light source device based on an image signal of an image required to be displayed;
    a projection optical system adapted to project the light modulated by the light modulation device on a screen; and
    the light source control device according to claim 1 adapted to control the light source device.

5. The projector according to claim 4, further comprising:
    a target light intensity calculation section adapted to obtain a signal representing the target light intensity from the image signal.

6. The projector according to claim 5, further comprising:
    an extension processing section adapted to perform an extension process of an image signal used for the modulation in the light modulation device in accordance with the target light intensity obtained by the target light intensity calculation section.

7. A projector comprising:
    a light source device;
    a light modulation device adapted to modulate a light from the light source device based on an image signal of an image required to be displayed;
    a projection optical system adapted to project the light modulated by the light modulation device on a screen; and
    the light source control device according to claim 2 adapted to control the light source device.

8. The projector according to claim 7, further comprising:
    a target light intensity calculation section adapted to
    obtain a signal representing the target light intensity from the image signal.

9. The projector according to claim 8, further comprising:
    an extension processing section adapted to perform an extension process of an image signal used for the modulation in the light modulation device in accordance with the target light intensity obtained by the target light intensity calculation section.

10. A light source control method of controlling a light source device having a plurality of solid-state light sources, the method comprising:
    determining a duty ratio, which is a ratio between an emission time period and an extinction time period of the solid-state light sources in a control period of the light source device, based on an information representing a target light intensity, which is a light intensity of light required to be emitted from the light source device;
    performing drive control of the plurality of solid-state light sources by generating a control signal having the duty ratio determined in the determining, and adapted to make a phase with which at least one of the solid-state light sources is driven different from a phase with which another of the solid-state light sources is driven;
    a current control section adapted to control a current supplied to the solid-state light sources in accordance with the target light intensity and the duty ratio determined by the determination section,
    wherein the current control section has a second table representing a relationship between the light intensity of the light emitted from the light source device, the duty ratio, and the current supplied to the solid-state light sources, and supplies the solid-state light sources with the current corresponding to the target light intensity and the duty ratio using the second table.

* * * * *